United States Patent [19]

Kakito et al.

[11] 4,073,028
[45] Feb. 14, 1978

[54] ETCHING PROCESSING APPARATUS

[75] Inventors: Akira Kakito, Hino; Junichi Yasui, Tama; Yoji Koganei, Fussa, all of Japan

[73] Assignee: Iwatsu Electric Co., Ltd., Japan

[21] Appl. No.: 710,603

[22] Filed: Aug. 2, 1976

[30] Foreign Application Priority Data

Sept. 30, 1975 Japan .................. 50-118654

[51] Int. Cl.² .......................................... B41F 35/00
[52] U.S. Cl. ............................................... 15/102
[58] Field of Search ............. 15/77, 100, 102; 134/9; 51/76 R

[56] References Cited

U.S. PATENT DOCUMENTS 3,237,231  3/1966  Zink ........................ 15/102
3,505,701  4/1970  Keil ......................... 15/102
3,562,834  2/1971  Stievanent et al. ........ 15/77 X
3,630,776  12/1971 Barr ........................ 15/77 X
3,694,071  9/1972  Touchette ................. 15/77 X
3,792,503  2/1974  Brock ...................... 15/77 X Primary Examiner—Edward L. Roberts
Attorney, Agent, or Firm—Oblon, Fisher, Spivak, McClelland & Maier

[57] ABSTRACT

This invention discloses an etching processing apparatus wherein a member in the form of a sponge is soaked in an etching processing liquid vessel, for rubbing a surface of a lithographic master, which is conveyed by an endless belt, which rotates in a predetermined direction, through the etching processing liquid, so that the non-imaged part of the lithographic master may be made hydrophilic by keeping an adequate pressure between the sponge-form member and the endless belt.

5 Claims, 3 Drawing Figures

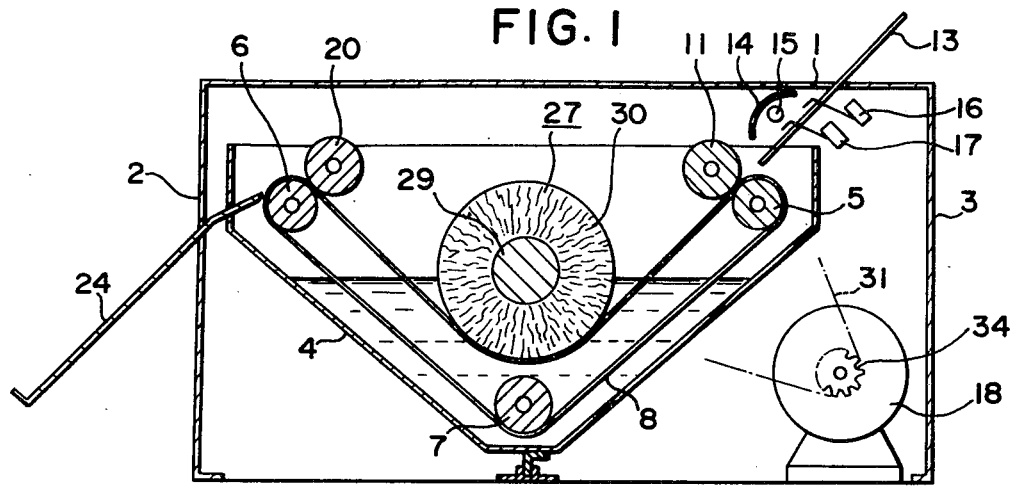
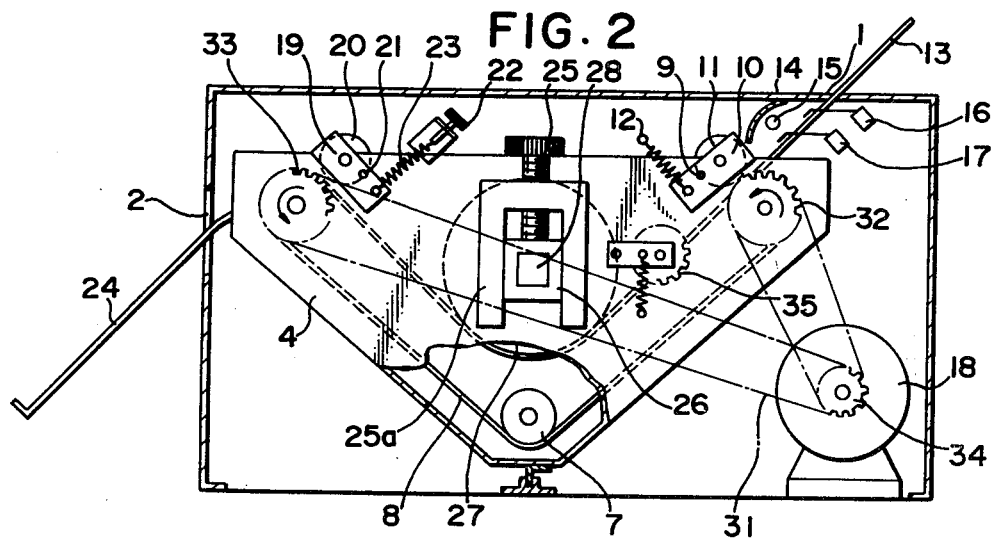
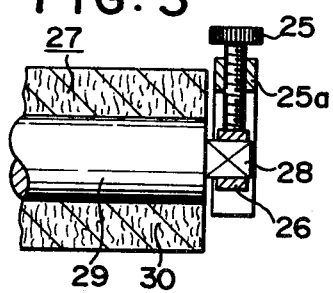

ETCHING PROCESSING APPARATUS

BACKGROUND OF THE INVENTION

1. Field of the Invention:

This invention relates generally to an etching processing apparatus which processes a lithographic master used in an offset printing machine, and especially to an apparatus making a surface of the lithographic master hydrophilic.

2. Description of the Prior Art:

Generally, a surface of the lithographic master for an offset printing machine comprises an imaged part being receptive to an ink and a non-imaged part, or blank which is ink-repellent, or receptive to water. Accordingly, it is necessary to perform a prior processing in order to make the non-imaged part of the lithographic master hydrophilic, in case that the lithographic master bearing an imaged part, visualized by a developer provided in a plate making apparatus, is set to an offset printing machine. This process in which the non-imaged part of the lithographic master is made to be hydrophilic is called an "etching process". If the etching process is imperfect, the ink adheres to the non-imaged part of the lithographic master during printing, so that any good image printing cannot be obtained and an enduring printing ability of the lithographic master to transfer the imaged part of a surface of the lithographic master to a plain paper decreases. Accordingly, a process for making a surface of the lithographic master hydrophilic is very important in offset printing.

Meanwhile, a conventional etching process generally employs the following two methods, though the etching process depends substantially on the material of the lithographic master. In the first etching method, the surface of the lithographic master is rubbed by a sponge, or an absorbent cotton, including an etching liquid, so as to form a thin hydrophilic film on the non-imaged part of the lithographic master, but this method is performed by manual work so that the quality of the etching process depends upon the experience of the worker, and further it takes a long time to perform the etching process. As a result thereof, this etching process is at a disadvantage where the etching is performed for making multiple lithographic masters.

According to the second etching method, the lithographic master itself is soaked in an etching vessel. However, this second method is superior to the first etching process method in the respect that an etching process for multi-lithographic masters can be performed and a uniform etching effect can be obtained, but in this second method, only the lithographic master soaks. As a result thereof, the second method has the following defects. First a pinhole-state blemish is produced due to a dust or bubble adhering to the surface of the master paper, so that the hydrophilic film cannot be formed at the position of the pinhole. As a result, there happens that the blemish of the master paper produces on a printing paper. The above-mentioned pinhole can be eliminated by soaking the master paper in the etching liquid vessel. However, the mechanical intensity of the lithographic master itself tends to fail when the lithographic master is soaked for a long time, where the lithographic master, including zinc oxide and the like, is used in the offset printing. Furthermore, to soak the lithographic master in the etching liquid vessel for a long time causes lowered efficiency of the etching process.

SUMMARY OF THE INVENTION

Accordingly, an object of the invention is to provide an automatic etching processing apparatus which may be utilized for making improved multi-lithographic masters for use in offset printing machines simply and without flaws.

Briefly, in accordance with the present invention the foregoing and other objects are in one aspect attained by the provision of an automatic etching processing apparatus which includes a sponge-form member for automatically rubbing the surface of a master paper being conveyed by an endless belt in the etching liquid, and means for keeping an adequate pressure therebetween, wherein the lithographic master bearing a developed visual image is achieved.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawing, wherein:

FIG. 1 is a schematic view illustrating an interior construction of the apparatus in accordance with the present invention;

FIG. 2 is a cut-away side view illustrating an etching processing apparatus of the present invention; and FIG. 3 is a cut-away side view of the sponge-form member shown in FIG. 1.

DETAILED DESCRIPTION OF THE PREFERRED EMBODIMENT

Referring now to the drawing, wherein like reference numerals designate identical or corresponding parts throughout the several views, and more particularly to FIG. 1 thereof, the fundamental principles of the present invention will now be described. There is provided an etching processing liquid vessel 4 arranged within a housing 3 having an entrance opening 1 and a discharge opening 2 for the lithographic master of an offset printing machine. A pair of rollers 5, 6 are supported on opposite sides of the etching processing liquid vessel 4, which is so devised that the middle part thereof is deepened, as in this case, being in a v-shaped or trough like configuration. An endless conveying belt 8 is movably supported between the pair of rollers 5, 6 and a soaking roller 7 positioned at a lower level in the lower part of the vessel 4, and the endless conveying belt 8 is wider than the lithographic master. A pressing roller 11 supported by a bracket 10, which is pivotably supported on the vessel 4 by a fulcrum pin 9, as shown in FIG. 2, is pressed toward the circumferential surface of the roller 5 by means of a spring 12.

Accordingly, the lithographic master on a guide plate 13 is pressed to the upper surface of the endless conveying belt 8 by the pressing roller 11. An infrared lamp 15, provided with a reflecting mirror 14, is exposed to the upper surface of the guide plate 13. A pair of limit switches 16, 17 are positioned under the guide plate 13, and feelers of the limit switches 16, 17 are exposed to the upper surface of the guide plate 13. The limit switches 16, 17 are incorporated into a power source circuit of a driving motor 18. When the upper limit switch 16 senses the front end of the lithographic master, the infrared lamp 15 lights. On the other hand, when the lower limit switch 17 senses the rear end of the master paper, the infrared lamp 15 extinguishes. A detailed description of such circuit will be omitted, for the circuit is well known to those skilled in the art.

A squeeze roller 20 is pressed to the circumferential surface of the roller 6, being supported by a bracket 19, which is pivotably supported on the vessel 4 by means of a fulcrum pin 21 and is provided with a spring means 23, one end of which is connected to the bracket 21, while the other end thereof is connected to an adjusting screw 22. Accordingly, the lithographic master being discharged from an etching process liquid disposed in the vessel 4 is squeezed by the squeezing roller 20 against the roller 6 and taken on a chute 24 from the vessel discharge opening 2.

A pair of guide blocks 25a is fixed to the side walls of the vessel 4, each being provided with a slider 26 slideable within the guide-block, wherein the slider 26 moves corresponding to the movement of a vertically moving screw 25, rotatably affixed thereto. The sliders 26 each have a square hole in which a square axis 28 for a roller rubbing means 27 comprises a central axis 29 interlocked with the square axis 28, and a tubular sponge-form rubbing member is arranged on the central axis 29. The sponge-form rubbing member 27 comprises a material which can absorb an etching processing liquid sufficiently and rub the surface of the lithographic master without causing flaws thereon. For example, the sponge-form rubbing member 27 may be a sponge, a ferret, a cotton or a similar material.

The rubbing member 27 may be driven by a driving chain 31. Sprockets 32, 33 are interlocked with the axis ends of the rollers 5, 6 upon which the driving chain 31 is hung. The conveying endless belt 8 is driven by a driving sprocket 34 of the driving motor 18 to which the driving chain 31 is hung. It is clear that a v-shaped belt, a pulley or a gear rack may be used as means for driving the rollers 5, 6, and thus that the drive is not limited to the sprocket chain.

In FIG. 2, 35 is a tension sprocket which keeps the driving chain 31 in a condition of tension.

According to the structure of this embodiment of the invention, the lithographic master from the entrance opening 1 is dried by the infrared lamp 15, and is pressed closely to the surface of the conveying endless belt 8 by means of the press roller 11. The lithographic master is then delivered to be soaked in the etching processing liquid by the rotation of the conveying belt 8. While the lithographic master is passing through the etching processing liquid, the surface of the lithographic master is rubbed by means of the sponge-form rubbing member 30. As a result thereof, dust and bubbles which heretofore adhered to the surface of the lithographic master are effectively eliminated. Accordingly, all of the non-imaged part of the lithographic master is processed so as to be hydrophilic, so that the hydrophilic film of the lithographic master may not bear any pinhole or the like.

As is clear from the above mentioned description, a uniform hydrophilic film, not having a pinhole, may be readily formed, even if the soaking time for the lithographic master in the etching processing liquid is shortened. Accordingly, even the lithographic paper, including zinc oxide and the like, can be processed in the etching liquid without losing any mechanical intensity of the master.

Obviously many modifications and variations of the present invention are possible in light of these teachings. It is, therefore, to be understood that within the scope of the appended claims, the invention may be practiced otherwise than as specifically described herein.

What is claimed as new and desired to be secured by letters patent of the United States is:

1. An etching processing apparatus for processing a lithographic master comprising:
    an etching processing liquid vessel containing a bath of etching liquid;
    an endless belt for conveying the lithographic master to be processed on a predetermined path through the etching processing liquid vessel and through the bath of etching liquid;
    driving means for rotating the endless belt in a predetermined direction;
    non-rotatable means disposed in the bath of etching liquid for frictionally rubbing a surface of the lithographic master being conveyed in the bath of etching liquid to render the surface of the lithographic master hydrophilic; and
    means for maintaining adequate pressure between the non-rotatable means for frictionally rubbing a surface of the lithographic master and the endless belt.

2. An etching processing apparatus for processing a lithographic master according to claim 1 wherein the pressure maintaining means comprises:
    at least one guide block fixed to the etching processing liquid vessel;
    slider means interlocked with the non-rotatable means for frictionally rubbing and slidably disposed within the guide block for vertically moving the non-rotatable means for frictionally rubbing;
    the slider means preventing the non-rotatable means for frictionally rubbing from rotating; and
    screw means for vertically adjusting the slider means to maintain an adequate pressure between the non-rotatable means for frictionally rubbing and the endless belt.

3. An etching processing apparatus for processing a lithographic master according to claim 1 wherein the non-rotatable means for frictionally rubbing comprises a sponge.

4. An etching processing apparatus for processing a lithographic master according to claim 1 wherein the non-rotatable means for frictionally rubbing comprises a cotton.

5. An etching processing apparatus for processing a lithographic master according to claim 1 wherein the non-rotatable means for frictionally rubbing comprises a ferret.

* * * * *